United States Patent [19]

Boccon-Gibod

[11] 3,882,528

[45] May 6, 1975

[54] SEMICONDUCTOR DEVICE FOR PRODUCING OR AMPLIFYING HIGH-FREQUENCY ELECTROMAGNETIC OSCILLATIONS

[75] Inventor: Dominique Boccon-Gibod, Paris, France

[73] Assignee: U.S. Philips Corporation, New York, N.Y.

[22] Filed: Oct. 2, 1973

[21] Appl. No.: 402,803

Related U.S. Application Data

[63] Continuation of Ser. No. 265,330, June 22, 1972, abandoned.

[30] Foreign Application Priority Data

June 24, 1971 France .............................. 71.22983

[52] U.S. Cl. .......................... 357/3; 357/15; 357/68; 357/80; 357/86; 331/107 G

[51] Int. Cl. ............................................... H01l 9/00

[58] Field of Search .. 317/234 V, 235 AE, 235 UA, 317/235 R; 331/107 G; 357/3, 15, 68, 80, 86

[56] References Cited

UNITED STATES PATENTS

| | | | |
|---|---|---|---|
| 3,508,125 | 4/1970 | Ertel et al. | 317/234 |
| 3,706,014 | 12/1972 | Dean | 317/235 R |

FOREIGN PATENTS OR APPLICATIONS

| | | | |
|---|---|---|---|
| 1,120,509 | 7/1968 | United Kingdom | 331/107 G |

OTHER PUBLICATIONS

Electronics Review, "GaAs on Sapphire," vol. 41, no. 14, July 8, 1968, p. 51.

*Primary Examiner*—Andrew J. James
*Assistant Examiner*—Joseph E. Clawson, Jr.
*Attorney, Agent, or Firm*—Frank R. Trifari; Leon Nigohosian

[57] ABSTRACT

A Gunn diode comprising a semiconductor layer having electrodes which, in the direction parallel to the layer, are situated at a distance. In order to stabilize the generation of domains and to counteract ionization phenomena at the anode, which restrict the life of the diode, at least a metal layer is provided which forms an ohmic contact with an electrode and forms a Schottky diode with a part of the semiconductor layer adjoining said electrode.

8 Claims, 4 Drawing Figures

Figure 1:
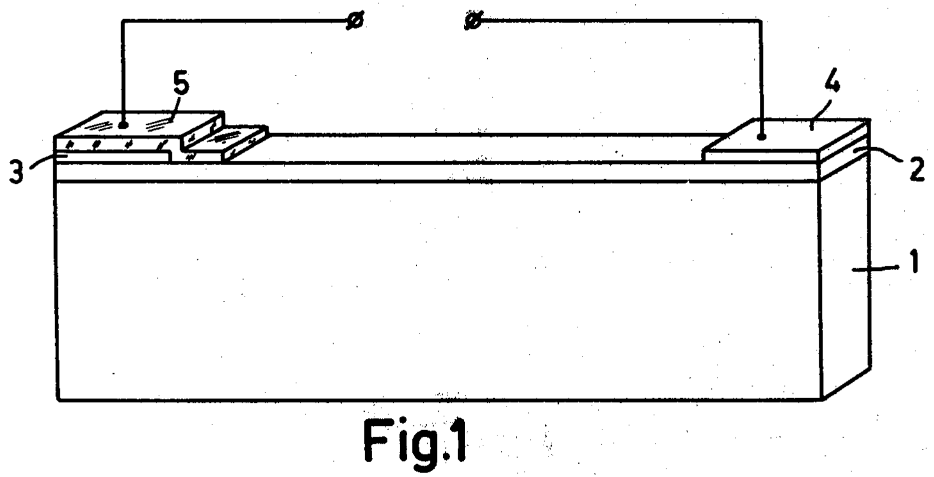

SEMICONDUCTOR DEVICE FOR PRODUCING OR AMPLIFYING HIGH-FREQUENCY ELECTROMAGNETIC OSCILLATIONS

This is a continuation, of application Ser. No. 265,330, filed June 22, 1972, now abandoned.

The invention relates to a semiconductor device for producing or amplifying high-frequency electromagnetic oscillations having a Gunn diode comprising a layer of a semiconductor material with a "two-valley" band structure in which a negative differential resistance can be produced by applying a sufficiently high electric field strength between two electrodes on the layer, on which layer two electrodes are provided which, in a direction parallel to the layer, are situated at a distance from each other and form ohmic contacts with the layer, Such devices in which the negative conductance-instabilities in semiconductor materials are used and with which so-called Gunn oscillations can be produced, are known. Gunn oscillations are to be understood to mean oscillations which are produced spontaneously in "two-valley" semiconductor materials, for example gallium arsenide, under the influence of a field strength the value of which exceeds a given threshold. For gallium arsenide said threshold voltage is approximately 3,000 volts per centimetre.

The structure of Gunn diodes is generally known. French Patent Application No. 1,517,751 describes such a diode which comprises a semiconductor body or a part of a semiconductor body of a given conductivity type which is provided with two ohmic contacts across which a voltage is applied so as to effect transmission of electrons from the main conduction band. The operation of such a device can be explained by the fact that at high field strength electron transmission takes place from the main conduction band (conduction band with high mobility) to a secondary conduction band of higher energy and lower mobility. The above-mentioned instabilities are the result of the formation of a domain of high electric field strength near the cathode, the propagation of said domain, and the disappearance thereof near the anode. The phenomenon is cyclic and the velocity of propagation of the domain is approximately $10^7$ cm/s. This process is repeated automatically and since the migration time of such a domain, that is to say the duration which such a domain requires to be formed and to propagate from the cathode to the anode in the material, may be very small (for example, approximately a few nanoseconds), it is possible to obtain oscillations of very high frequencies. Known devices of this type oscillate at a frequency which is determined by the migration time of a domain.

A first drawback of these known devices is that in accordance with the polarisation, the domains will be formed either on the one or on the other electrode without it being possible to distinguish the input of the bipolar device from the output.

Another drawback of these known devices is the ionisation occurring near the anode; the generation and the propagation of the domains from the cathode to the anode actually is a cyclic process; when the domain arrives near the anode, it disappears; when ionized charges are present near the anode, said charges have a deionisation time which is not equal to the migration time of the domain, said deionisation time being usually much larger; a space charge is formed at the level of the anode so that the active length of the diode becomes shorter; as a result of this the frequency and the amplitude of the oscillations vary, and, in the boundary case, the oscillations discontinue and the diode may even be destroyed. In certain circumstances, the duration of use of such a diode can thereby even be restricted to only 1 to 5 oscillations, A further drawback of the known devices is the fact that the domain is generated at the area of the disturbed crystal zone which is formed by providing the cathode contact.

One of the objects of the invention is to be able to distinguish between the input and the output of the diode of the above type; since the frequency differs in accordance with the direction of polarisation, said asymmetric device may be used in such manner that the threshold voltage is sufficiently small to cause no reflection phenomena in the circuit arrangements supplied by such a device.

Another object of the invention is to prevent the ionisation occurring near the anode so as to considerably increase in this manner the life of such diodes.

A third object of the invention is to cause generation of the domains in the vicinity of the cathodes to occur more easily and more regularly.

The invention is inter alia based on the recognition of the fact that by a particular structure of the cathode and/or the anode contact, the drawbacks associated with known devices of this type can be avoided or be decreased at least considerably.

Therefore, according to the invention a device of the type described in the preamble is characterized in that at least a metal layer is present which forms an ohmic contact with an electrode and forms a rectifying contact ("Schottky"-diode) with a part of the semiconductor layer adjoining said electrode.

In the device according to the invention an electrode may consist of a metal contact provided on the semiconductor layer and alloyed or not alloyed in the semiconductor material, or of a highly doped semiconductor zone of the same conductivity type as the layer provided in or on the semiconductor layer, for example, by diffusion or epitaxy, which zone may comprise, if desirable, a metal contact layer.

By this invention it is possible to manufacture asymmetric diodes the oscillation frequency of which is not the same in accordance with the polarisation of the diode.

Due to the invention it is also possible to prevent stray effects which are caused by the ionisation near the anode.

Due to the invention it is in addition possible to obtain an easier and more regular generation of domains in the vicinity of the cathode.

By the correct choice of an adapted profile of the edge of a metal layer which is partially provided on the cathode contact, the regularity of generating the domains is considerably improved.

Figure 2:
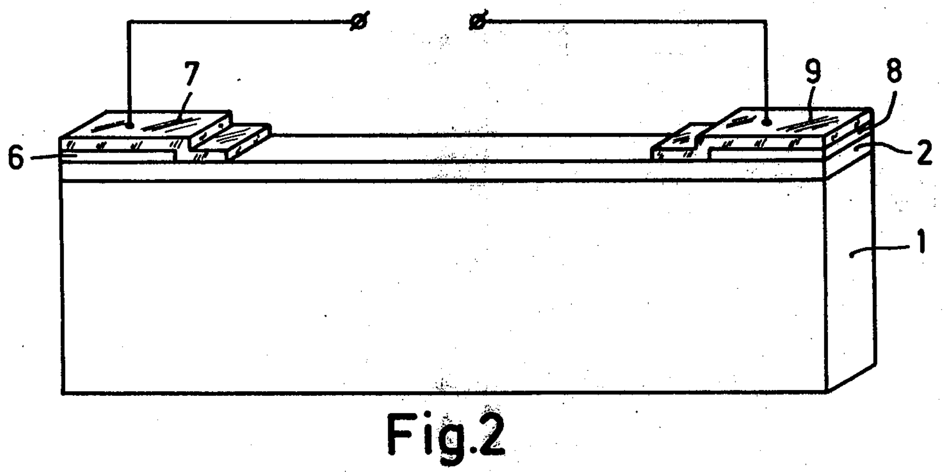
Figure 3:
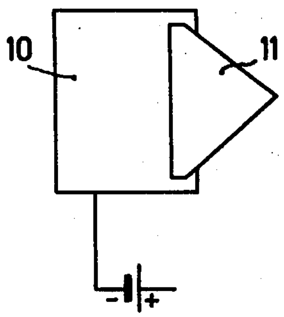
Figure 4:
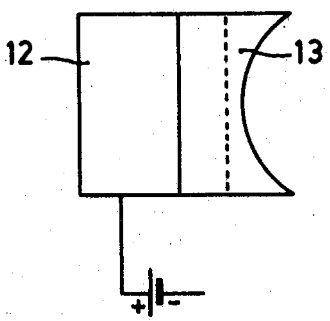

The invention will now be described in greater detail with reference to an embodiment and the drawing, in which FIG. 1 is a perspective view of a Gunn diode according to the invention, FIG. 2 shows a variation of the device according to the invention, FIG. 3 shows a variation of the construction of the cathode end of a Gunn diode according to the invention, FIG. 4 shows a variation of the construction of the anode end of a Gunn diode according to the invention.

For clarity of the figures, the length and the thickness of the regions which constitute the Gunn diode are shown exaggeratedly and are not drawn to scale.

The Gunn diode according to the invention shown in FIG. 1 comprises a substantially insulating substrate 1, for example of semi-insulating gallium arsenide, on which an epitaxial layer 2 of *n*-conductive semiconductor material, for example gallium arsenide, is provided. The "electrodes" of the diode are ohmic contacts 3 and 4 which are obtained either by providing a strongly $n^+$ conductive epitaxial layer, or by providing and alloying a eutectic layer, for example a layer of Au-Ge, on the $n^+$ conductive layer of the diode.

According to the invention, the diode also comprises a metal layer 5 which is provided on the electrode 3. Said metal layer 5 is, for example, of aluminium and constitutes a rectifying metal-semiconductor contact with the layer 2 (Schottky-diode).

The operation of the Gunn diode according to the invention may be explained as follows: upon applying the supply voltage between the electrodes 3 and 4, the electrode 3 is the anode and the electrode 4 is the cathode when the electrode 3 is connected to the positive terminal and the electrode 4 to the negative terminal. The successive domains of large electric field strength are constituted by the left-hand edge of the electrode 4 and propagate in the direction of the electrode 3 under the influence of the electric field which is present in the layer 2 as a result of the voltage applied across the diode, but before said domains have reached the electrode 3 they are short-circuited by the Schottky-diode which is polarized in the forward direction and the anode of which is constituted by the metal layer 5.

So with this structure it is possible to prevent ionisation near the anode and to control the oscillation frequency of the diode by varying the length of the metal layer 5.

When the polarity of the supply voltage applied to the Gunn diode according to the invention is varied, the cathode is formed by the electrode 3 and the *p-n* Schottky diode is polarized in the reverse direction which corresponds to a decrease of the effective thickness of the layer 2 of semiconductor material as a result of the presence of a depletion zone in the epitaxial layer 2 below the layer 5; this results in a higher electric field strength.

When the metal layer 5 overlaps the active part of the body of the Gunn diode according to the invention over a length which is equal to at least 10 $\mu$ and equal to at most 50 $\mu$, the depletion zone is relatively important and as a result of this there prevails a high electric field strength at said end which facilitates the generation of the domains at the edge of the metal layer 5 present outside the region disturbed by the alloying or by the $n^+$ conductive layer and the domains are generated in an accurately localized place.

The length across which the metal layer 5 overlaps the layer 2 in the direction of the contact 4 determines the "effective length" of the diode body independently of the direction of polarisation of the supply voltage.

So with such a semiconductor device it is possible to achieve oscillation frequencies which differ in accordance with the distance between the metal zone 5 and the electrode 4.

FIG. 2 shows a variation of the structure according to the invention; this structure comprises a semi-insulating substrate 1, an epitaxial semiconductor layer 2 on the substrate 1, an electrode 6 covered by a metal layer 7, and a second electrode 8 covered by another metal layer 9. Both metal layers 7 and 9 constitute Schottky diodes with the layer 2. Due to the presence of the two Schottky diodes of which one is present on the anode and the other is present on the cathode, both the ionisation near the anode contact can be prevented and the generation of the regions in the vicinity of the cathode contact can be made to occur more easily and more regularly.

FIG. 3 shows a particular geometry of the metal layer 11 which in this case is partially provided on a cathode contact 10. The layer 11 tapers in the direction of the anode.

As a result of the triangular structure, a field configuration is obtained in the tip of the triangle which is known as "tip effect;" in this manner a very stable generation of the domains is localized in a very accurately determined place and frequencies are achieved which are entirely stable. As a result of the said tip effect, lower supply voltages may be applied.

FIG. 4 shows another particular geometry of the metal layer 13 which in this case is provided on the anode 12. As a result of such a structure in the form of an arc of a circle the centre of which lies between the cathode and the anode, the surface via which the domain disappears is increased as a result of which ionisation can be prevented more effectively.

Diodes according to the invention were manufactured on substrates 1 having an overall length of 1 mm, a width of approximately 200 $\mu$, the epitaxial semiconductor layer 2 on the substrate had a thickness of approximately 20 $\mu$, the doping concentration lying between $10^{15}$ and $10^{16}$ atoms/ccm, the distance between the electrodes being 100 $\mu$ to 300 $\mu$. The metal layers according to the invention were obtained by vapour deposition. The length of overlapping of the metal layer was approximately 15 $\mu$.

Semiconductor devices according to this invention can be used for high speed pulse circuits and in the field of the rapid digital electronics.

It will be obvious that the invention is not restricted to the examples described but that many variations are possible to those skilled in the art without departing from the scope of this invention. For example, other "two valley" semiconductors than GaAs, for example InP, may be used, while the metals used may also differ. Instead of semi-insulating GaAs, an insulating substrate of, for example, $Al_2O_3$ or glass may be used. It is also pointed out that, although in the embodiments described the electrodes and the metal layers are all provided on the same part of the semiconductor layer, the two electrodes (with associated metal layers) may also be provided on oppositely located sides of the semiconductor layer or both between the semiconductor layer and the substrate.

What is claimed is:

1. A semiconductor device for producing or amplifying high frequency electromagnetic oscillations, said device comprising:

a. a semiconductor layer having a first conductivity type and characterized by a two-valley band structure;
b. two spaced electrodes respectively comprising an anode and a cathode located at and forming ohmic contacts with said layer, said semiconductor layer, anode and cathode comprising a Gunn diode structure, whereby a negative differential resistance can be produced by applying an electric field between said anode and cathode; and
c. at least said anode having a first metal layer in ohmic contact therewith at a first portion of said first metal layer and a second portion of said first metal layer disposed between said anode and cathode and forming a Schottky-diode type rectifying contact with an active part of said semiconductor layer adjoining said anode.

2. A semiconductor device as recited in claim 1, wherein at least one of said electrodes comprises a highly doped semiconductor zone of said first conductivity type adjoining said semiconductor layer.

3. A semiconductor device as recited in claim 1, further comprising and a second metal layer provided to said cathode, said second metal layer comprising a first portion in ohmic contact with said contact and a second portion disposed between said cathode and said anode and forming a Schottky diode type rectifying contact with an active part of said semiconductor layer adjoining said cathode respective said metal layers.

4. A semiconductor device as recited in claim 3, wherein said second portion of at least one of said metal layers extends on said semiconductor layer in the direction of the other of said electrodes over a distance of at least 10 microns and at most 50 microns.

5. A semiconductor device as recited in claim 3, wherein at least said second portion of said second metal layer associated with said cathode faces and tapers in the direction of said anode.

6. A semiconductor device as recited in claim 1, wherein said first metal layer associated with said anode, comprises an edge that faces said cathode and has the form of an arc of a circle having a center which lies between said edge and said cathode.

7. A semiconductor device as recited in claim 1, wherein said semiconductor layer consists of n-type gallium arsenide and said metal layer consists essentially of aluminum.

8. A semiconductor device as recited in claim 1, further comprising a substantially insulating substrate, said layer being disposed on said substrate.

* * * * *